(12) United States Patent
Teppan (10) Patent No.: US 7,969,140 B2
(45) Date of Patent: Jun. 28, 2011

(54) MAGNETIC FIELD SENSOR AND ELECTRICAL CURRENT SENSOR THEREWITH

(75) Inventor: Wolfram Teppan, Collonges-s-Salève (FR)

(73) Assignee: Liaisons Electroniques-Mecaniques LEM S.A., Plan-les-Ouates (CH)

( * ) Notice: Subject to any disclaimer, the term of this patent is extended or adjusted under 35 U.S.C. 154(b) by 0 days.

(21) Appl. No.: 12/459,691

(22) Filed: Jul. 7, 2009

(65) Prior Publication Data

US 2009/0295384 A1   Dec. 3, 2009

(51) Int. Cl.
*G01R 15/18* (2006.01)
*G01R 15/20* (2006.01)
*G01R 33/07* (2006.01)

(52) U.S. Cl. .................................. 324/127; 324/117 H
(58) Field of Classification Search .............. 324/117 H, 324/117 R, 126, 127
See application file for complete search history.

(56) References Cited

U.S. PATENT DOCUMENTS

| | | | |
|---|---|---|---|
| 4,262,275 A * | 4/1981 | DeMarco et al. | ........... 338/32 H |
| 4,362,990 A | 12/1982 | Schuermann et al. | |
| 4,454,553 A | 6/1984 | Iwasaki | |
| 4,486,279 A * | 12/1984 | Fromson et al. | .............. 205/653 |
| 5,180,970 A | 1/1993 | Ross | |
| 5,552,700 A | 9/1996 | Tanabe et al. | |
| 5,619,240 A | 4/1997 | Pong et al. | |
| 6,323,636 B1 | 11/2001 | Cattaneo et al. | |
| 6,411,078 B1 * | 6/2002 | Nakagawa et al. | ....... 324/117 H |
| 6,472,878 B1 | 10/2002 | Bruchmann | |
| 6,642,704 B2 | 11/2003 | Hastings et al. | |
| 6,717,396 B2 * | 4/2004 | Viola | ......................... 324/117 R |
| 6,759,840 B2 * | 7/2004 | Marasch et al. | .......... 324/117 H |
| 6,794,860 B2 * | 9/2004 | Schafer | ....................... 324/117 H |
| 6,998,840 B2 * | 2/2006 | Choi et al. | .................... 324/253 |
| 7,622,909 B2 * | 11/2009 | Teppan | ......................... 324/126 |
| 2003/0001559 A1 * | 1/2003 | Goto et al. | ................ 324/117 H |
| 2006/0226826 A1 | 10/2006 | Teppan | |

* cited by examiner

*Primary Examiner* — Roberto Velez
(74) *Attorney, Agent, or Firm* — Clifford W. Browning; Krieg DeVault LLP (57) ABSTRACT

A magnetic field sensor comprises a magnetic field sensing cell and a magnetic shield comprising at least two parts separated by an air-gap and surrounding the magnetic field sensing cell positioned in a cavity of the magnetic shield.

20 Claims, 8 Drawing Sheets

MAGNETIC FIELD SENSOR AND ELECTRICAL CURRENT SENSOR THEREWITH

Applicant claims foreign priority benefits under Title 35 U.S.C. §119 of Swiss Application PCT/IB2004/000580 filed on Feb. 18, 2004, and Applicant claims priority benefits under Title 35 U.S.C. §120 of U.S. patent application Ser. No. 10/545,984 filed on Aug. 18, 2005.

This invention relates to a magnetic field sensor for measuring magnetic induction (magnetic flux density). This invention also relates to an electrical current sensor for measuring the electrical current flowing in a conductor by sensing the magnetic field generated by the conductor.

Many conventional current sensors have a magnetic circuit comprising a core of magnetic material provided with an air-gap in which a magnetic field sensor, such as a Hall effect sensor, is positioned. The conductor in which the current to be measured flows, often called a "primary conductor", passes through the magnetic circuit one or several times. Such sensors are commonly found in applications where relatively large electrical currents are measured, or in applications where simple devices, such as current shunts or transformers, cannot be used for reasons such as the need for galvanic isolation or the presence of D.C. components in the current to be measured.

Current sensors of the aforementioned type can usually be categorized into three groups: closed-loop sensors, open-loop sensors, and a group of modified open-loop sensors that use a transformer effect for high frequencies.

Closed-loop sensors rely on the principle of compensation of the current linkage generated by the primary conductor through which the current to be measured flows by means of a secondary coil that is driven by an electrical circuit controlled by the magnetic field sensor placed in the magnetic circuit air-gap. As a result, the magnetic induction in the air-gap of the magnetic circuit is adjusted to be as small as possible in order to obtain a negligible measurement error.

Open-loop sensors rely on the measurement of magnetic induction in the air-gap of the magnetic circuit surrounding the primary conductor. The magnetic induction in the air-gap is proportional to the current to be measured as long as the magnetic permeability of the magnetic circuit is much higher than that of air or other materials filled in the air-gap that have permeability values close to that of air (which is approximately equal to 1). In modified open-loop sensors with transformer effect, low frequency currents are measured in the same way as the above described open-loop sensors, whereas high frequencies are measured by a secondary winding connected to a current measuring shunt. High frequency components of the primary current are transferred to the secondary winding by a transformer effect, whereby the signal of the shunt is added electronically to the signal of a device measuring the induction air-gap. This enables the usable frequency range of open-loop sensors to be extended, since unmodified open-loop sensors are typically unable to follow the steeply-rising currents of high frequencies because of Eddy current effects in the magnetic core and the limited bandwidth of common magnetic field sensors.

Open-loop current sensors are generally less complicated and less costly than closed-loop sensors, however they have the disadvantage of being less linear and stable and thus have a higher measurement error.

Magnetic field sensors, such as Hall effect sensors, exhibit high offset and gain drifts with respect to temperature, with the further disadvantage of being sensitive to mechanical stress.

Such problems limit the use of Hall effect sensors in applications with relatively high temperatures, or subject to mechanical stresses, for example due to relative thermal expansion of components on which the sensor is mounted. Such problems occur for example in Integrated Power Modules (IPM) that have semi-conductor power chips mounted on a ceramic substrate, often called "DCB" (Direct Copper Bonding) technology. During operation of IPM's, temperatures in a range of 120° C. are common, such temperatures being problematic for stable and linear operation of Hall cells without offset drift.

Other known magnetic field sensors, such as fluxgate sensors or magnetoimpedance sensors, are more stable and have low offset and gain drift compared to Hall sensors. They are however limited by their magnetic induction measuring range which is in the order of several milli-Tesla (mT), whereas in the air-gap of open-loop current sensors, induction levels of more than 100 mT are common.

There are many applications, in addition to those related to electrical current measurement, where it is desirable to measure magnetic inductions in adverse temperature and/or mechanical stress situations.

Considering the aforementioned disadvantages, an object of this invention is to provide a current sensor, that has a high degree of linearity and stability over a large operating range, and that is subject to low offset and gain drift. It is further advantageous that such sensor be cost effective and compact.

Another object of this invention is to provide a magnetic field sensor that has a low offset and gain drift and that is able to measure large magnetic induction levels. It is further advantageous to provide a magnetic field sensor that is robust and that can operate accurately over a large range of temperatures.

Objects of this invention have been achieved by providing a magnetic field sensor according to claim 1, and an electrical current sensor according to claim 8.

Objects and advantageous features of the invention will be apparent from the following description, claims and drawings, in which:

FIG. 2b is a view in perspective of an underside of the sensing cell shown in FIG. 2a;

Referring to the figures, an electrical current sensor 2 for measuring a primary current $I_p$ in a primary conductor 1, comprises a magnetic circuit 3 and a magnetic field sensor 4, 104, 204, 304, 404. The magnetic circuit 3 comprises a magnetic core 5 of a magnetically permeable material and is provided with an air-gap 6 between end faces 27a, 27b in which the magnetic field sensor is positioned. The magnetic core 5 is shown as a generally annular-shaped part with a central opening 7, through which the primary conductor 1 extends. Other magnetic circuit shapes could however be provided, such as rectangular, polygonal, toroidal or otherwise, without departing from the scope of this invention. Moreover, the primary conductor 1 is shown as extending through the magnetic circuit, however, the primary conductor could also be provided with a number of windings or conductor portions wrapped around the magnetic circuit core 5 and extending through the opening 7. The magnetic material of the magnetic core 5 may be provided with the properties found in known current sensors of this general type and may have a laminated construction to reduce eddy currents.

Figure 4:
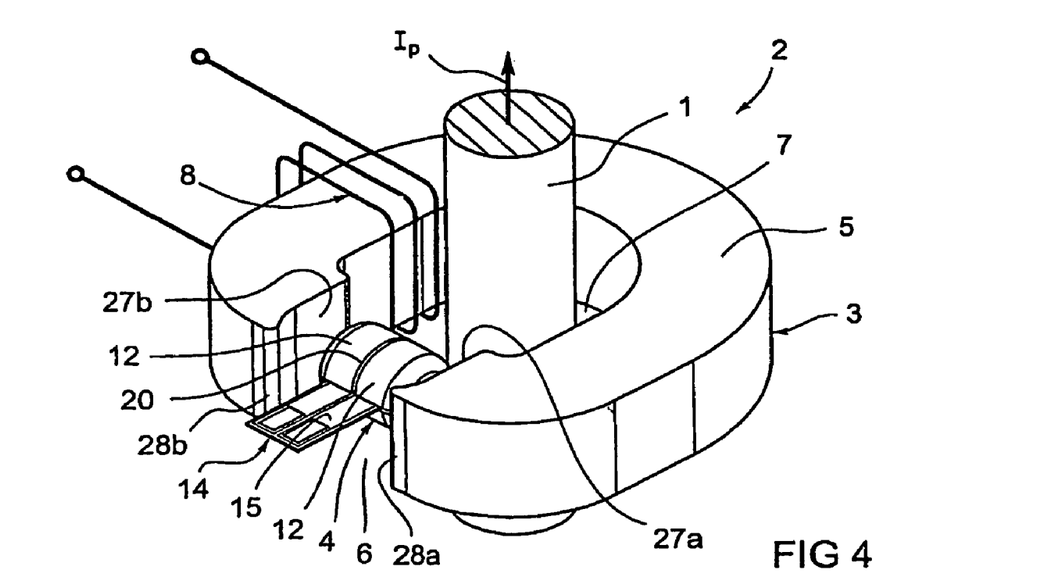
FIG. 4 is a view in perspective of an embodiment of a current sensor according to this invention.
Figure 5:
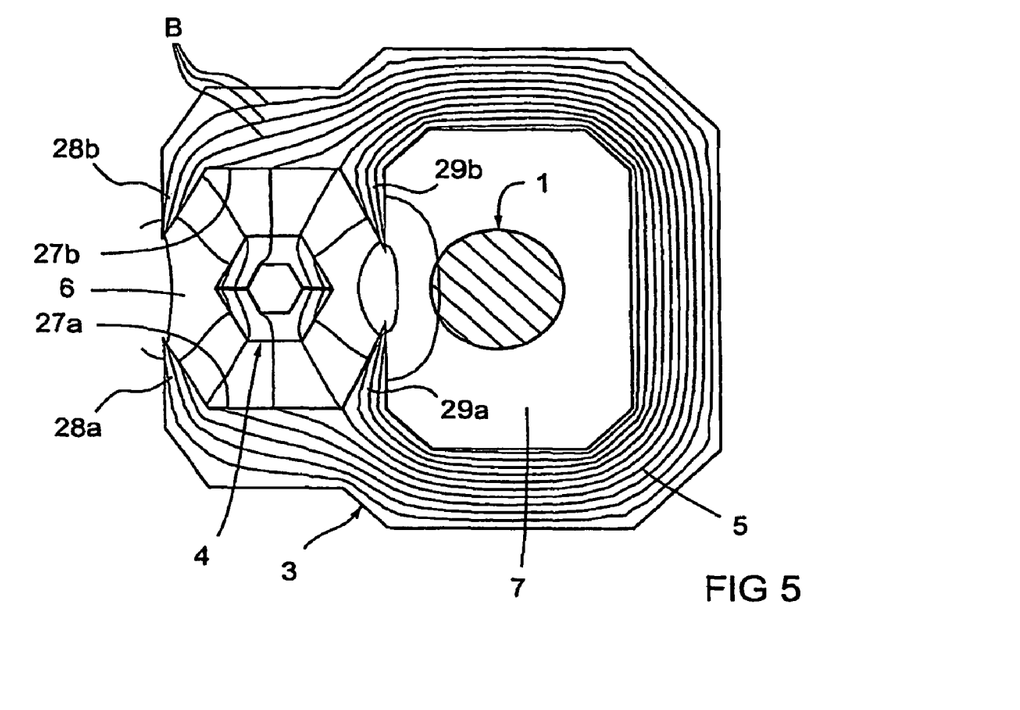
FIG. 5 is a plan view of an embodiment of a magnetic circuit of a current sensor according to this invention, with a magnetic shield positioned in an air-gap of the magnetic circuit, showing magnetic flux lines B.

As best seen in FIG. 4 or 5, the end faces 27a, 27b of the magnetic core 5 advantageously each have an extension 28a, 28b at the outer periphery of the core that reduces the width of the air-gap. These outer extensions advantageously reduce the effect of interference by magnetic fields generated outside the current sensor by conducting the external magnetic flux along the outer periphery of the magnetic core, thus avoiding the magnetic field sensor 4, 104, 204, 304, 404. For reasons of symmetry, extensions 29a, 29b may also be provided along the inner periphery of the magnetic core 5.

The current sensor may have the general characteristics of an open-loop current sensor, in that there is no secondary coil or conductor for compensating the ampere turns generated by the primary conductor as found in closed-loop sensors. The sensor may however be provided with a secondary winding 8 around the magnetic core 5 for detecting high frequency currents by the transformer effect as shown in FIG. 4.

Figure 1:
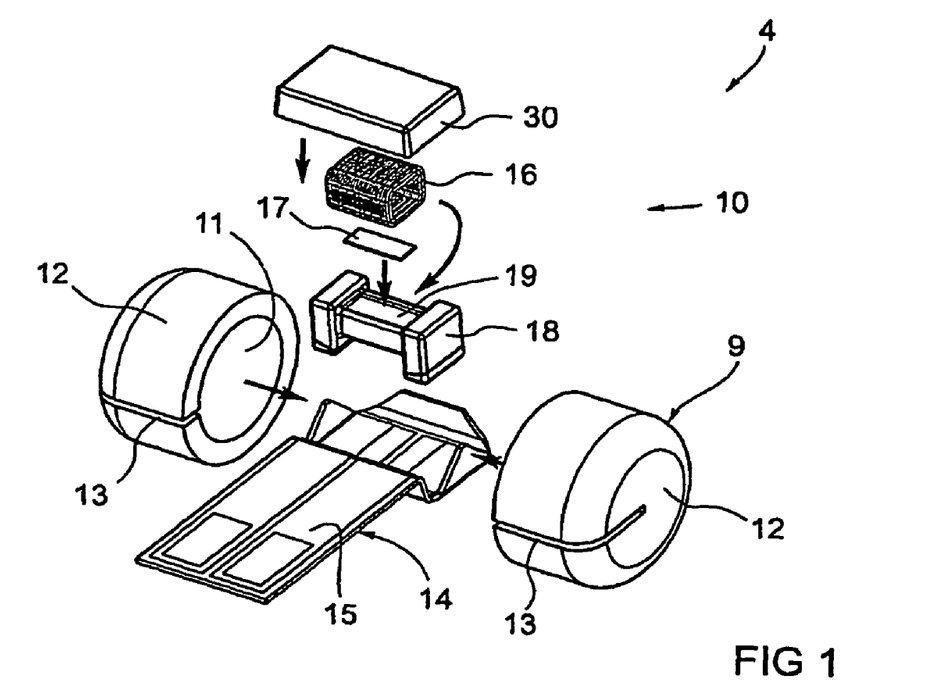
FIG. 1 is an exploded view in perspective of a first embodiment of a magnetic field sensor according to the invention.
Figure 2A:
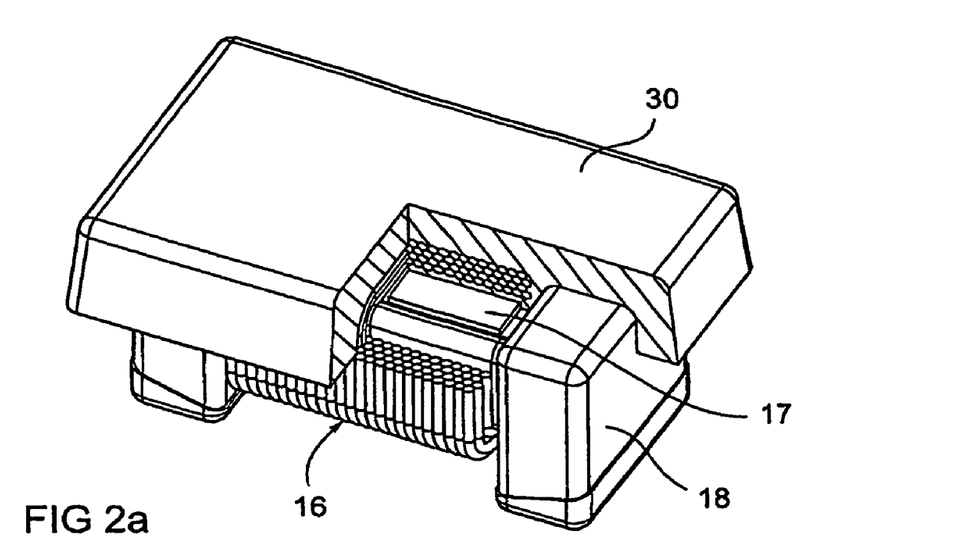
FIG. 2a is a partial cross-sectional view in perspective of a sensing cell of a magnetic field sensor according to the invention.
Figure 2B:
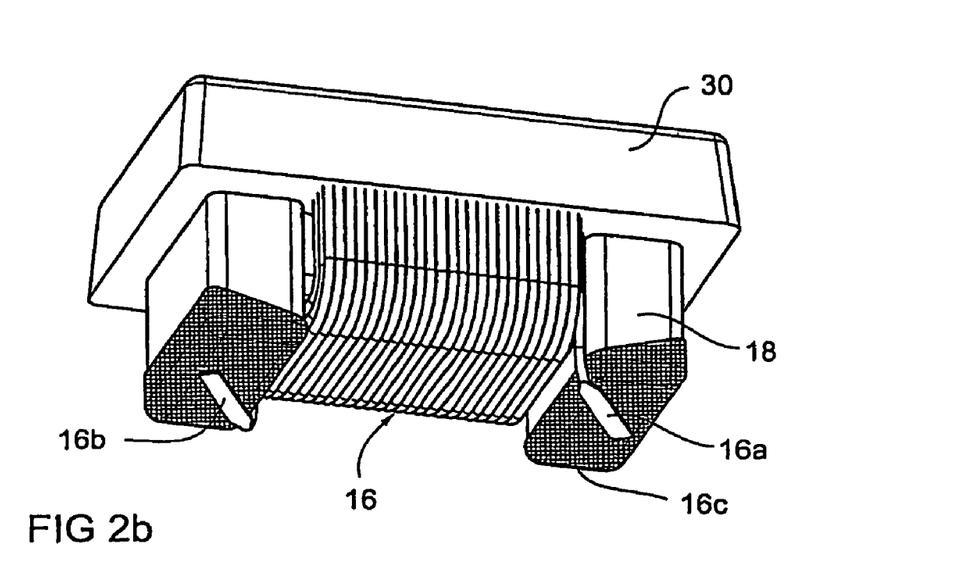
Figure 6:
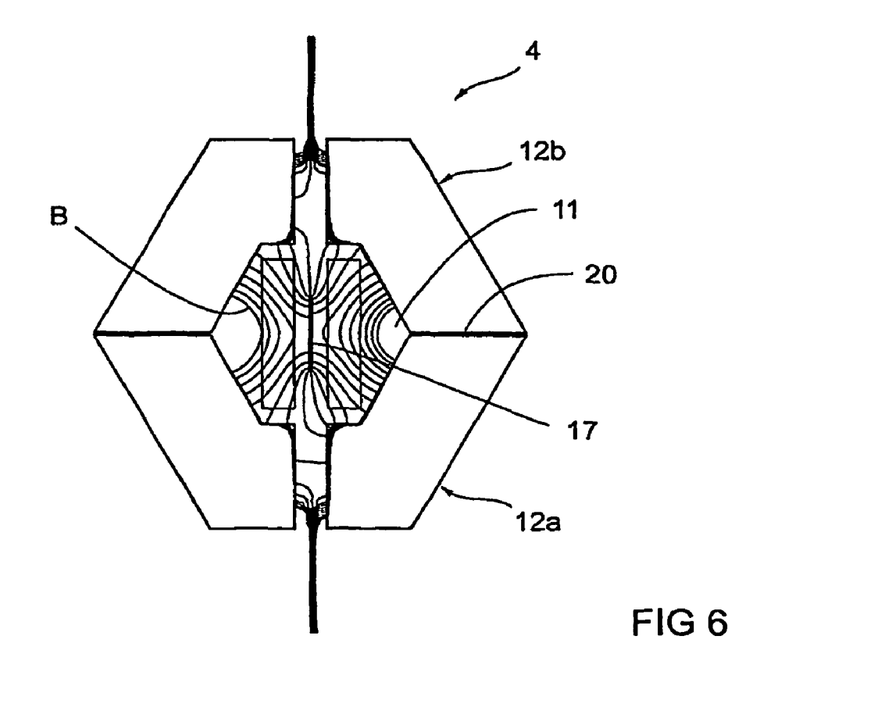
FIG. 6 is a detailed cross-sectional view of the magnetic shield of the embodiment of FIG. 5.

The magnetic field sensor 4, 104, 204, 304, 404 comprises a magnetic shield 9, 109, 209, 409 made of a soft magnetic material and a sensing cell 10, 310 positioned in a cavity 11 of the magnetic shield. The magnetic shield comprises at least two shell portions 12, 112, 212 separated by a small air-gap 20 therebetween. The magnetic shield 9 has a generally axisymmetric or cylindrical shape in the embodiment shown in FIG. 1 and is arranged such that the central axis of the cylinder is substantially in line with the magnetic flux lines extending across the current sensor air-gap 6. The magnetic shield may however be provided with non-axisymmetric shapes, for example having rectangular (see FIGS. 8, 9 and 12), polygonal or elliptical cross-sections. It is also possible to provide the magnetic shield with a non-prismatic shape, for example as seen in the longitudinal cross section the embodiment of the magnetic shield 9 shown in FIG. 6.

Figure 8:
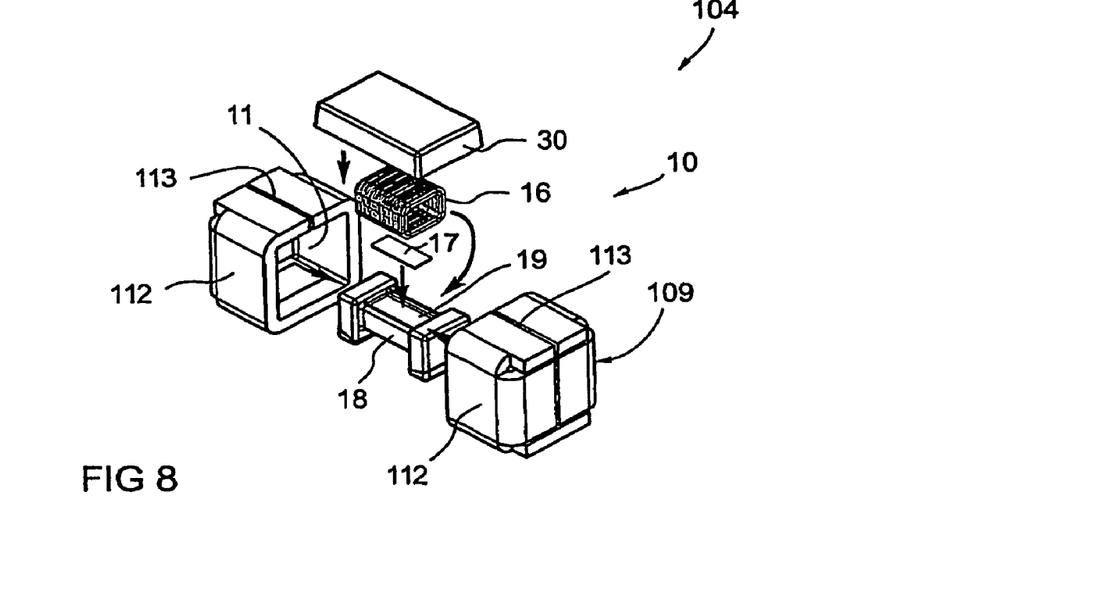
FIG. 8 is an exploded view in perspective of a second embodiment of a magnetic field sensor according to the invention.
Figure 9:
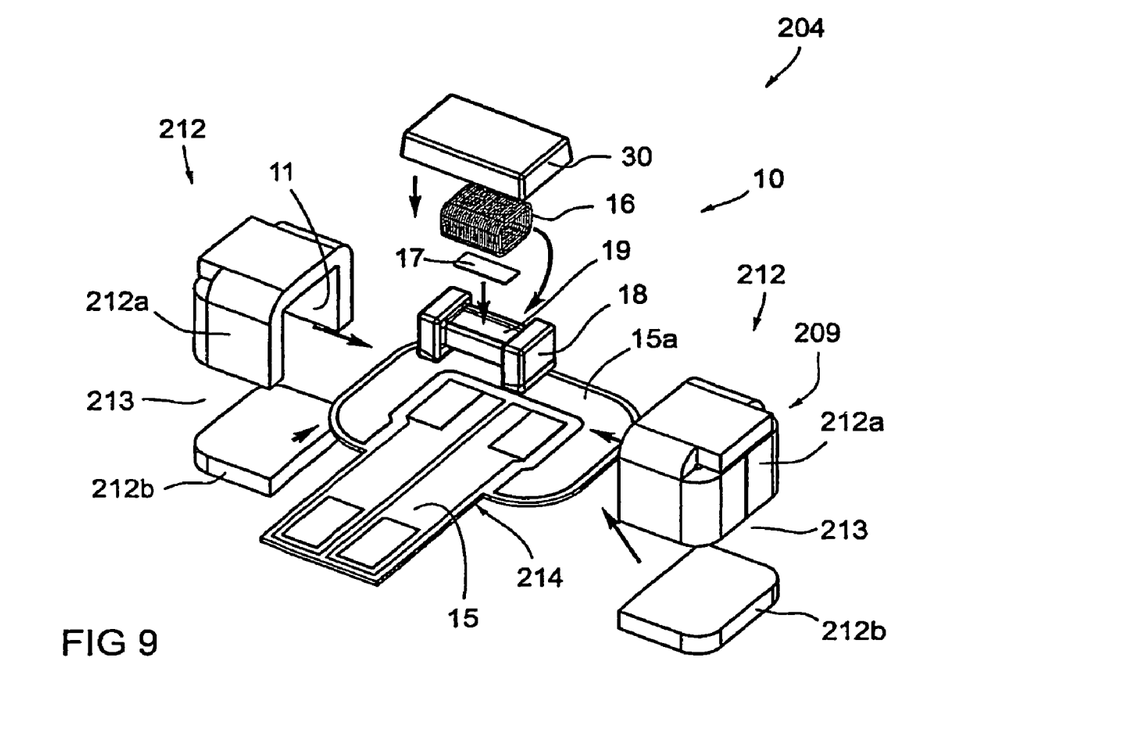
FIG. 9 is an exploded view in perspective of a third embodiment of a magnetic field sensor according to the invention.

In the embodiments of FIGS. 8 and 9, the magnetic shield 109, 209 is wholly or partially stamped and formed from sheet metal that may be annealed after forming to ensure homogeneous and optimal magnetic properties like high magnetic permeability and low coercive force. The stamping and forming of the magnetic shield in high volumes is particularly cost effective compared to machined shields.

Figure 12:
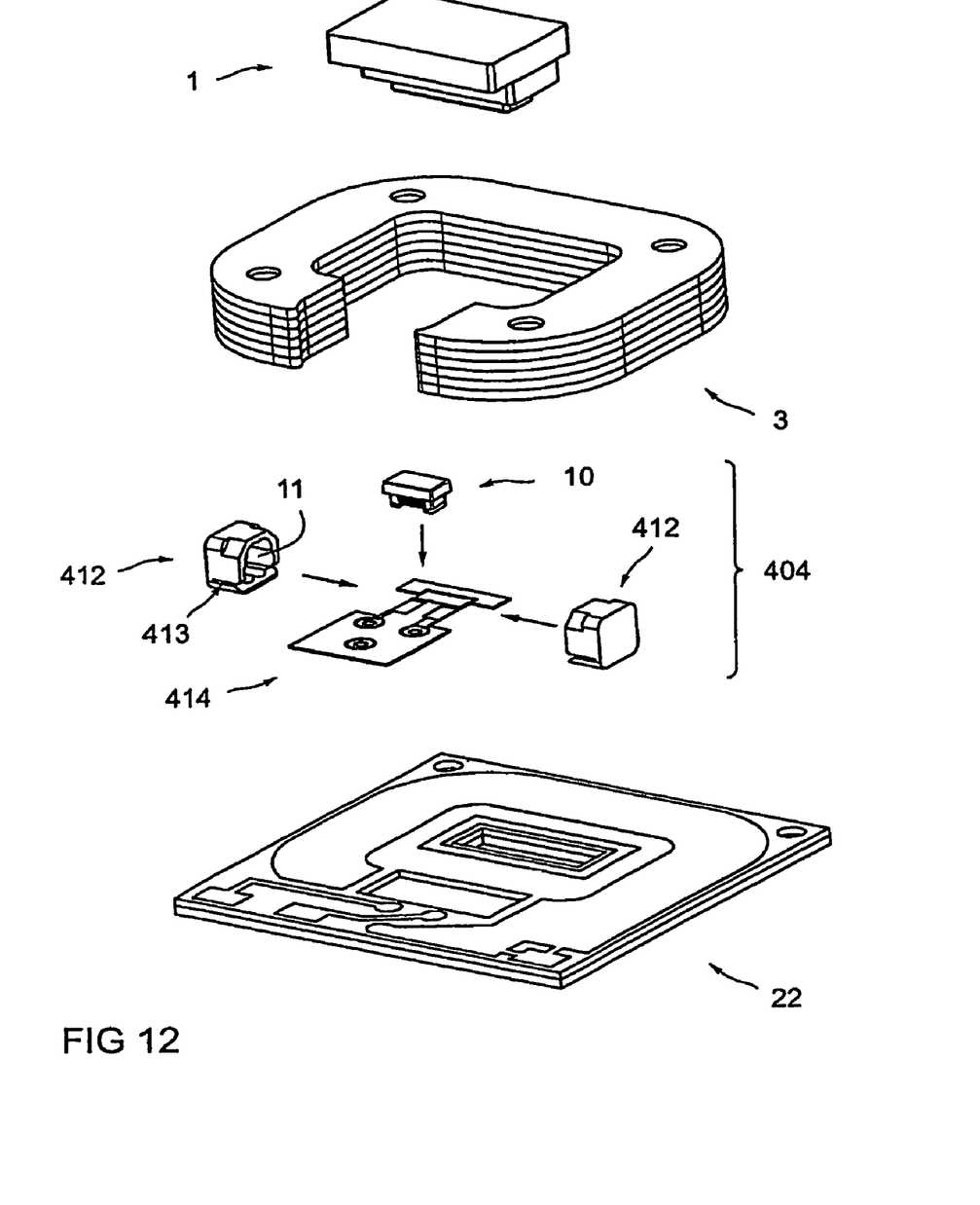
FIG. 12 is an exploded view in perspective of a packaged electrical current sensor according to this invention.

The shell portions 412 of the magnetic shield may also be machined from a magnetically permeable material, as shown in FIG. 12.

The air-gap 20 may be filled with a material having a low permeability (in other words a non-magnetic material). Preferably, the air-gap comprises a material, such as solder or adhesive, for bonding the pair of shell parts 12, 112, 212, 412 together. A longitudinal slot 13, 113, 213, 413 extending essentially parallel to the axis of the magnetic field sensor is provided in the magnetic shield 9, 109, 209, 309, 409 and serves to reduce Eddy currents in the soft magnetic shield. The slot may also serve as a passage into the magnetic shield for a conducting member 14, 214, 414 for connection to the sensing cell 10, 310. In the embodiments of FIG. 8, the slot 213 is provided by the separation of the magnetic shield shell parts into first and second portions 212a and 212b that are assembled on opposing sides of a substrate of the conducting member 214. The thickness of the substrate thus defines the width of the longitudinal slot 213.

In the embodiment of FIG. 12, the longitudinal slot 413 is machined in the shell parts 412 and the substrate 414 is inserted into the slot during assembly.

The conducting member 14, 414 may be in the form of a flexible printed circuit with conductive tracks 15 for connecting an electronic circuit 22 (see FIGS. 7 and 12) for processing the sensor signals to the magnetic field sensing cell 10, 310. As shown in FIG. 9, the printed circuit may also be provided with metallized portions 15a for soldering the portions 212a and 212b of the magnetic shield parts thereto. The portions of the magnetic shield parts could however also be bonded to the conducting member with an adhesive or fixed by mechanical means.

The magnetic field sensing cell 10, 310 comprises a coil 16 and a saturable soft magnetic core 17, 317. The coil 16 is mounted on a bobbin 18 provided with a groove 19 or cavity 319 in which the soft magnetic core 17, 317 is mounted. In the embodiments shown, the coil 16 is made of an insulated electrical wire electrically connected, via its extremities 16a, 16b bonded to connection pads 16c, to respective conductive tracks 15 of the conducting member 14, 214. The coil and bobbin may be partially overmoulded with a casing 30, that serves not only to protect the coil, but also to position the sensing cell within the cavity of the magnetic shield.

Figure 3A:
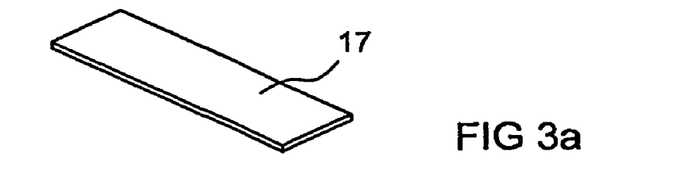
FIGS. 3a, 3b and 3c, are views in perspective of variants of soft magnetic cores of sensing cells according to this invention.
Figure 3B:
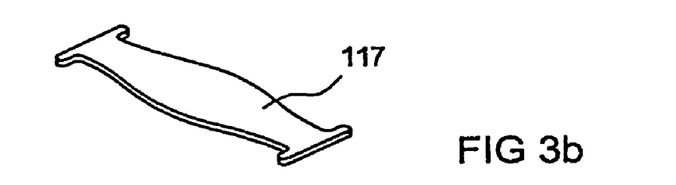
Figure 3C:
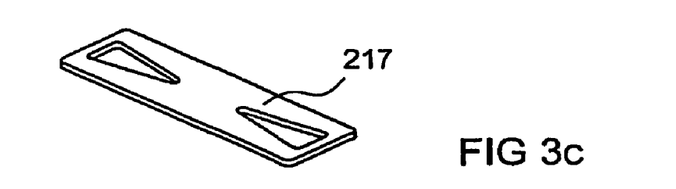

The soft magnetic core 17, 117, 217 is advantageously made of a fine ribbon of a soft-magnetic material with a thickness preferably below 0.1 mm. The ribbon 17, 117, 217 may have a cross section that varies over its length, as shown in the different variants of FIGS. 3a to 3c, in order to achieve magnetic induction values that are essentially constant all over its volume, which aids to saturate the ribbon in a very abrupt manner and leads to a current threshold for the saturation of the fluxgate that can easily be detected by the associated electronic circuit.

Figure 10:
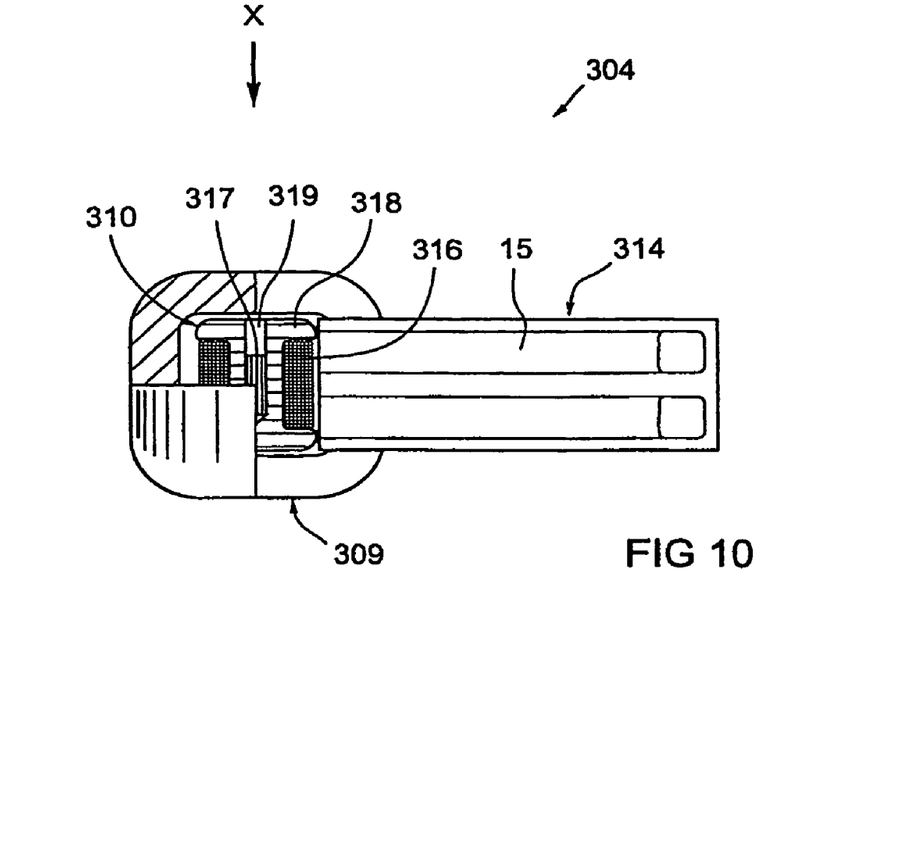
FIG. 10 is a partial, cross-sectional view of a magnetic field sensor according to another embodiment of the invention.
Figure 11:
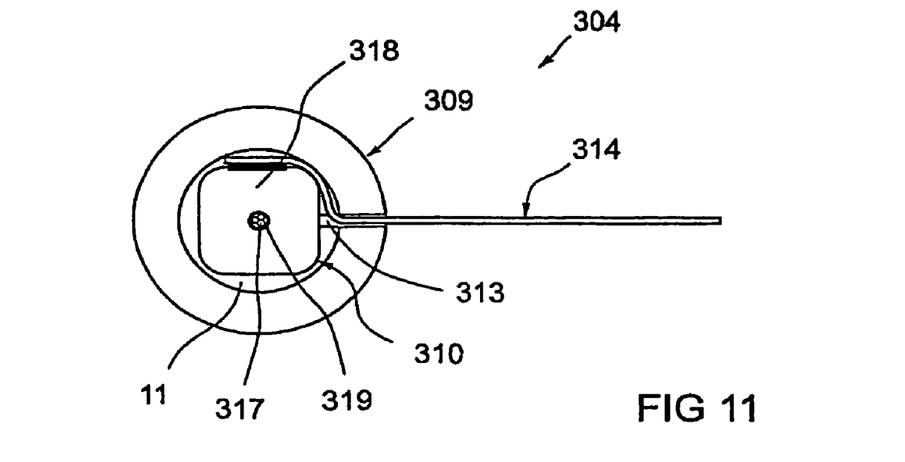
FIG. 11 is a view in a direction of arrow X of the magnetic field sensor of FIG. 10 with the upper half of the magnetic shield removed.

The soft magnetic core 317, as shown in the embodiment of FIGS. 10 and 11, could be made also of a plurality of very fine wires made of soft magnetic material, bundled or bonded together to form a generally cylindrical shape, positioned in a cavity 319 of the bobbin 318. Preferably, the wires are very thin, for example having diameters in the range of 10 to 50 microns, for example 30 microns, and bonded together with a dielectric material in order to minimize Eddy currents. This enables the sensing cell 310 to operate at very high frequencies without loss of linearity.

The magnetic field sensing cell 10, 310 described above is operated in a similar manner to known fluxgate sensors. There are different known techniques by which fluxgate sensors may be controlled by an electronic circuit to determine the value of the induction to be measured, such techniques also being applicable to control the magnetic field sensing cell according to this invention.

Fluxgate sensors are very stable and precise, and have a low offset drift and gain. The main disadvantage of fluxgate sensors is however that they have a low magnetic induction operating range, usually in the order of only a few milli-Teslas, and are therefore not found in electrical current sensors with large magnetic fields.

In the present invention, this problem is overcome by placing the magnetic field sensing cell 10, 310 in the magnetic shield 9, 109, 209 with air-gap 20, that acts as an induction divider. The magnetic shield 9, 109, 209 conducts most of the magnetic flux, the proportion depending on the width of the air-gap 20 between the shell parts 12, 112, 212, 412. The magnetic induction inside the shield is directly proportional to the magnetic induction present in the soft magnetic material of the shield, however of a significantly lower value.

By way of example, if the magnetic shield has a magnetic permeability of $\mu_r=10^5$ and the air-gap between shell parts 12, 112, 212, 412 is 10 microns wide, and the magnetic induction in the air-gap 6 of the current sensor is 60 mT, the magnetic induction inside the core 17, 317 of the sensing cell 10, 310 is less than 2 mT.

Advantageously therefore, the magnetic field sensor 4, 104, 204, 304 can be used to measure magnetic inductions as large as 100 to 200 mT, while benefiting from the precision and stability, and the absence of offset and gain drift, of a fluxgate sensing cell.

Instead of a fluxgate sensor, it is possible to employ other types of sensitive magnetic field sensing cells that also exhibit low temperature offset and gain drift. Examples of other such magnetic field sensing cells that may be used in the present invention, are so called giant magnetoimpedance sensors or magnetoresistive sensors of any kind.

It may be noted that the magnetic field sensor according to this invention may be employed not only to measure magnetic induction in an air-gap of a current sensor, but also to measure magnetic induction in other applications, such as magnetic induction generated in transducers, for example position sensors, proximity switches or encoders, and other magnetic field systems.

Figure 7:
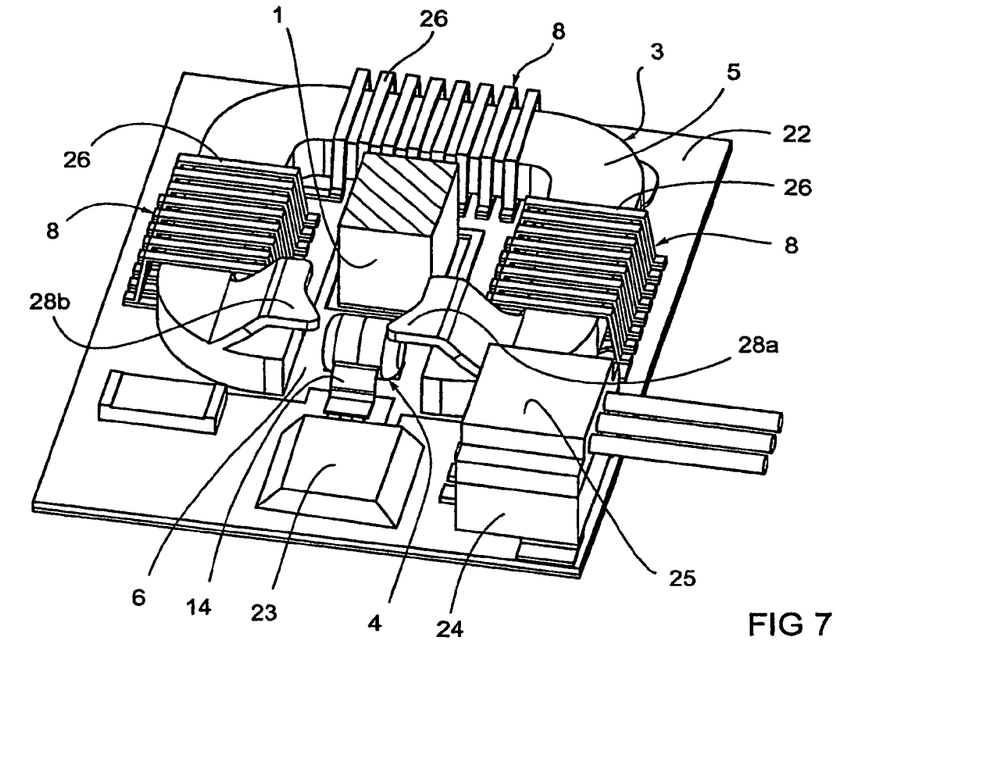
FIG. 7 is a view in perspective of an embodiment of a packaged electrical current sensor according to this invention.

Referring to FIG. 7, an example of a current sensor according to this invention for use in an integrated power module (IPM) is shown. The current sensor is shown mounted on a substrate of a circuit board 22, which may for example be of a ceramic material with conductive tracks thereon. The magnetic circuit 3 is fixed directly on the circuit board 22 and surrounds a primary conductor bar 1 that extends therethrough. The magnetic field sensor, which may have the construction of any of the aforementioned embodiments, may also be bonded directly on the printed circuit board, whereby the flexible circuit 14 thereof is conductively connected to conductive traces that connect the magnetic field sensor to an ASIC 23 for processing the sensor input and output signals. External connections to the circuit board may be provided via a connector 24 mounted on the circuit board and pluggable to a complementary cable connector 25.

Conductors of the secondary winding 8 are, in this embodiment, in the form of U-shape wires 26 positioned over portions of the magnetic core 5 and bonded onto circuit traces of the circuit board 22. The secondary coil circuit traces pass underneath the magnetic core 5 so as to form, with the U-shape wires, essentially a coil surrounding the magnetic core.

Advantageously, a particularly compact and resistant current sensor, in particular to high operating temperatures, is provided.

The invention claimed is:

1. Open-loop electrical current sensor for measuring a primary electrical current $I_p$ flowing in a primary conductor (1), including a magnetic circuit (3) comprising a generally annular shaped core (5) of soft magnetic material surrounding a central opening (7) configured to allow a primary conductor to extend therethrough and having an air-gap (6) formed between end faces (27a, 27b) of said core, and a magnetic field sensor positioned in the air-gap, the magnetic field sensor comprising a magnetic field sensing cell (10, 310) and a magnetic shield (9, 109, 209, 409) made of a magnetic material comprising at least two parts (12, 112, 212, 412) separated by an air-gap (20) and surrounding the magnetic field sensing cell positioned within a cavity (11) of the magnetic shield, the magnetic field sensing cell comprising a saturable soft magnetic core (17, 317) surrounded by a coil (16) connected to a circuit for generating and processing the electrical signals of the magnetic field sensing cell in order to provide an output signal that is a function of the primary electrical current.

2. Open-loop electrical current sensor according to claim 1, wherein the magnetic field sensing cell comprises a flexible circuit (14, 214) extending into the magnetic shield through a slot (13, 113, 213) and connected to said coil (16) of the sensing cell.

3. Open-loop electrical current sensor according to claim 1, further comprising a circuit board (22) with conductive tracks thereon, wherein the magnetic field sensor (4, 104, 204, 304, 404) is mounted on the circuit board.

4. Open-loop electrical current sensor for measuring a primary electrical current $I_p$ flowing in a primary conductor (1), including a magnetic circuit (3) comprising a generally annular shaped core (5) of soft magnetic material surrounding a central opening (7) configured to allow a primary conductor to extend therethrough and having an air-gap (6) formed between end faces (27a, 27b) of said core, and a magnetic field sensor positioned in the air-gap, the magnetic field sensor comprising a magnetic field sensing cell (10, 310) and a magnetic shield (9, 109, 209, 409) made of a magnetic material comprising at least two parts (12, 112, 212, 412) separated by an air-gap (20) and surrounding the magnetic field sensing cell positioned within a cavity (11) of the magnetic shield, the magnetic field sensing cell comprising a saturable soft magnetic core (17, 317) surrounded by a coil (16) connected to a circuit for generating and processing the electrical signals of the magnetic field sensing cell in order to provide an output signal that is a function of the primary electrical current, further comprising a circuit board (22) with conductive tracks thereon, wherein the magnetic field sensor (4, 104, 204, 304, 404) is mounted on the circuit board and wherein the magnetic field sensor comprises a flexible circuit (14, 214, 414) that is conductively connected to conductive traces on the circuit board that connect the magnetic field sensor to an Application Specific Integrated Circuit (ASIC) (23) mounted on the circuit board for processing the sensor input and output signals.

5. Electrical current sensor for measuring the electrical current $I_p$ flowing in a primary conductor (1), including a magnetic circuit (3) comprising a core (5) of magnetic material surrounding a central opening (7) through which the primary conductor extends and having an air-gap (6) formed between end faces (27a, 27b) of said core, and a magnetic field sensor mounted in the air-gap, the magnetic field sensor comprising a magnetic field sensing cell (10, 310) and a magnetic shield (9, 109, 209, 409) made of a magnetic material comprising at least two parts (12, 112, 212, 412) separated by an air-gap (20) and surrounding the magnetic field sensing cell mounted within a cavity (11) of the magnetic shield, wherein the magnetic field sensing cell comprises a soft magnetic core (17, 317) surrounded by a coil (16) connected to a circuit for generating and processing the electrical signals of the magnetic field sensing cell in order to provide an output signal that is a function of the magnetic signal to be measured.

6. Electrical current sensor according to claim 5, wherein the magnetic field sensing cell comprises a flexible circuit (14, 214) extending into the magnetic shield through a slot (13, 113, 213) and connected to said coil (16) of the sensing cell.

7. Electrical current sensor according to claim 5, further comprising a secondary conductor (8) wound around the core (5) of the magnetic circuit for measuring high frequency currents by a transformer effect.

8. Electrical current sensor according to claim 7, wherein the secondary conductor (8) is in the form of U-shape wires (26) positioned over portions of the core (5) of soft magnetic material and bonded onto conductive tracks of a circuit board (22).

9. Electrical current sensor according to claim 7, further comprising a circuit board (22) with conductive tracks thereon.

10. Electrical current sensor according to claim 9, wherein the magnetic circuit (3) is fixed directly on the circuit board.

11. Electrical current sensor according to claim 10, wherein the magnetic field sensor (4, 104, 204, 304, 404) is fixed directly on the circuit board.

12. Electrical current sensor for measuring the electrical current $I_p$ flowing in a primary conductor (1), including a magnetic circuit (3) comprising a core (5) of magnetic material surrounding a central opening (7) through which the primary conductor extends and having an air-gap (6) formed between end faces (27a, 27b) of said core, and a magnetic field sensor mounted in the air-gap, the magnetic field sensor comprising a magnetic field sensing cell (10, 310) and a magnetic shield (9, 109, 209, 409) made of a magnetic material comprising at least two parts (12, 112, 212, 412) separated by an air-gap (20) and surrounding the magnetic field sensing cell mounted within a cavity (11) of the magnetic shield, further comprising a circuit board (22) with conductive tracks thereon, wherein the-magnetic field sensor comprises a flexible circuit (14, 214, 414) that is conductively connected to conductive traces on the circuit board that connect the magnetic field sensor to an Application Specific Integrated Circuit (ASIC) (23) mounted on the circuit board for processing the sensor input and output signals.

13. Magnetic field sensor configured to be positioned in an external magnetic field generated by a magnetic field generating system positioned outside of the sensor, comprising a magnetic field sensing cell (10, 310) and a magnetic shield (9, 109, 209, 409) made of a magnetic material comprising at least two parts (12, 112, 212, 412) separated by an air-gap (20) and surrounding the magnetic field sensing cell positioned within a cavity (11) of the magnetic shield, wherein the magnetic field sensing cell comprises a soft magnetic core (17, 317) surrounded by a coil (16) connected to a circuit for generating and processing the electrical signals of the magnetic field sensing cell in order to provide an output signal that is a function of the magnetic signal to be measured.

14. Magnetic field sensor according to claim 13, wherein the soft magnetic core of the magnetic field sensing cell comprises one or more ribbons made of a soft magnetic material.

15. Magnetic field sensor according to claim 13, wherein the soft magnetic core of the magnetic field sensing cell comprises fine wires made of a soft magnetic material bundled together.

16. Magnetic field sensor according to claim 13, wherein the magnetic shield has an essentially axisymmetric shape about a central axis and is arranged in a magnetic field to be measured such that the central axis is substantially parallel to flux lines of the magnetic field.

17. Magnetic field sensor according to claim 13, wherein the air-gap of the magnetic shield is essentially planar and perpendicular to the magnetic flux lines.

18. Magnetic field sensor according to claim 13, wherein the magnetic shield is provided with a longitudinal slot (13, 113, 213, 413) to reduce eddy currents in the magnetic shield.

19. Magnetic field sensor according to claim 13, wherein the magnetic shield is at least partially stamped and formed from sheet metal.

20. Magnetic field sensor configured to be positioned in an external magnetic field generated by a magnetic field generating system positioned outside of the sensor, comprising a magnetic field sensing cell (10, 310) and a magnetic shield (9, 109, 209, 409) made of a magnetic material comprising at least two parts (12, 112, 212, 412) separated by an air-gap (20) and surrounding the magnetic field sensing cell positioned within a cavity (11) of the magnetic shield, further comprising a flexible circuit (14, 214) extending into the magnetic shield through a slot (13, 113, 213) and connected to a coil (16) of the sensing cell.

\* \* \* \* \*